US010424932B2

United States Patent
Endo et al.

(10) Patent No.: US 10,424,932 B2
(45) Date of Patent: Sep. 24, 2019

(54) ENERGY MANAGEMENT CONTROLLER, ENERGY MANAGEMENT METHOD, AND PROGRAM

(71) Applicant: Mitsubishi Electric Corporation, Tokyo (JP)

(72) Inventors: Satoshi Endo, Tokyo (JP); Hirotoshi Yano, Tokyo (JP); Masaaki Yabe, Tokyo (JP); Satoshi Minezawa, Tokyo (JP); Ichiro Maruyama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 499 days.

(21) Appl. No.: 15/127,129

(22) PCT Filed: Jul. 28, 2014

(86) PCT No.: PCT/JP2014/069844
§ 371 (c)(1),
(2) Date: Sep. 19, 2016

(87) PCT Pub. No.: WO2016/016931
PCT Pub. Date: Feb. 4, 2016

(65) Prior Publication Data
US 2017/0207632 A1    Jul. 20, 2017

(51) Int. Cl.
*H02J 13/00* (2006.01)
*H02J 3/38* (2006.01)
(Continued)

(52) U.S. Cl.
CPC ............ *H02J 3/383* (2013.01); *H02J 7/0068* (2013.01); *H02J 13/00* (2013.01); *H02J 13/001* (2013.01); *G01R 21/133* (2013.01); *Y04S 10/40* (2013.01)

(58) Field of Classification Search
CPC .... H02J 3/38; H02J 3/383; H02J 3/385; H02J 13/00; H02J 7/00; G01R 21/133
See application file for complete search history.

(56) References Cited

U.S. PATENT DOCUMENTS 8,417,391 B1 * 4/2013 Rombouts .............. G05B 13/02
700/291
9,768,832 B2 * 9/2017 Nishibayashi .......... H02J 13/00
(Continued)

FOREIGN PATENT DOCUMENTS

JP    2004-020284 A    1/2004
JP    2011-004544 A    1/2011
(Continued)

OTHER PUBLICATIONS

Office Action dated Aug. 29, 2018 issued in corresponding EP patent application No. 14898422.2.
(Continued)

*Primary Examiner* — Hai L Nguyen
(74) *Attorney, Agent, or Firm* — Posz Law Group, PLC

(57) ABSTRACT

An energy management controller acquires, for each of power lines in a demand area, from devices, measurement data relating to a power value measured by each device. The energy management controller selects, when power values are measured from a single power line, one power value as a power value measured from the power line, based on a priority assigned beforehand to each device. Then, the energy management controller manages power consumed in the demand area using the power value measured from each power line. Furthermore, the energy management controller causes an operation terminal to display, in a predetermined mode, information indicating the power value measured from each power line.

9 Claims, 7 Drawing Sheets

(51) Int. Cl.
 *H02J 7/00* (2006.01)
 *G01R 21/133* (2006.01)

(56) References Cited

U.S. PATENT DOCUMENTS

| | | | | |
|---|---|---|---|---|
| 9,869,704 | B2 * | 1/2018 | Ishihara | G01R 35/04 |
| 10,135,248 | B2 * | 11/2018 | Sato | H01M 10/44 |
| 2014/0340075 | A1 | 11/2014 | Doi et al. | |

FOREIGN PATENT DOCUMENTS

| | | | |
|---|---|---|---|
| JP | 2011-244621 | A | 12/2011 |
| JP | 2012-145466 | A | 8/2012 |
| JP | 2013-210288 | A | 10/2013 |
| JP | 2014-039362 | A | 2/2014 |
| WO | 2013/069671 | A1 | 5/2013 |

OTHER PUBLICATIONS

Office Action dated Mar. 21, 2017 issued in corresponding JP patent application No. 2016-537624 (and partial English translation).
Office Action dated Dec. 14, 2018 issued in corresponding CN patent application No. 201480079395.7 (and English translation).
International Search Report of the International Searching Authority dated Oct. 14, 2014 for the corresponding international application No. PCT/JP2014/069844 (and English translation).
Extended European Search Report dated Jan. 4, 2018 issued in corresponding EP patent application No. 14898422.2.
Office action dated May 8, 2019 issued in corresponding CN patent application No. 201480079395.7 (and English translation thereof).

\* cited by examiner

MEASUREMENT DATA

| DEVICE ID | POWER LINE ID | MEASUREMENT TIME | POWER VALUE (kW) |
|---|---|---|---|
| 10 (POWER MEASUREMENT DEVICE 4) | 01 (POWER LINE D1) | 2014/07/01 10:20:10 | X.X |

| POWER LINE ID | DEVICE ID | PRIORITY | DEVICE ID | PRIORITY |
|---|---|---|---|---|
| 01 (POWER LINE D1) | 10 (POWER MEASUREMENT DEVICE 4) | 1 | 11 (EV-PCS 5) | 2 |
| 03 (POWER LINE D3) | 10 (POWER MEASUREMENT DEVICE 4) | 1 | 11 (EV-PCS 5) | 2 |

ENERGY MANAGEMENT CONTROLLER, ENERGY MANAGEMENT METHOD, AND PROGRAM

CROSS REFERENCE TO RELATED APPLICATION

This application is a U.S. national stage application of International Patent Application No. PCT/JP2014/069844 filed on Jul. 28, 2014, the content of which is incorporated herein by reference.

TECHNICAL FIELD

The present disclosure relates to an energy management controller, an energy management method and a program.

BACKGROUND

As taught in Patent Literature 1, using one power measurement device that measures power values from power lines is technology that is known.

PATENT LITERATURE

Patent Literature 1: Unexamined Japanese Patent Application Kokai Publication No. 2013-210288

Recently, the introduction of energy management systems, that is, so-called home energy management systems (HEMS), is progressing in ordinary homes. Further, technology is known for energy management within a home by associating the HEMS with other systems such as an electric vehicle (EV) power conditioning system (EV-PCS) and the like.

For example, the EV-PCS is required to measure power values from a plurality of power lines within the home in order to control charging and discharging of a storage battery installed in the electric vehicle. On the other hand, the HEMS also uses a power measurement device to measure power values from the plurality of power lines within the home. Thus the power value for the single power line may possibility be measured by both the EV-PCS and the HEMS.

In the above circumstance, if a controller included in the HEMS is able to select one power value, which is more appropriate, and if that power value can be used for energy management within the home, then advantages can be anticipated, such as the providing of accurate state of use of power, achievement of accurate operation control of the control target device, and the like.

However, there are presently no useful proposals yet for such technology.

SUMMARY

In consideration of the aforementioned circumstances, the object of the present disclosure is to provide an energy management controller and the like capable of performing power management and the like by selection of an optimum power value from among a plurality of power values measured from a single power line.

In order to achieve the aforementioned object, the energy management controller of the present disclosure includes:

measurement power acquisition means for acquiring, for each of a plurality of power lines in a demand area, from one or a plurality of devices, measurement data relating to a power value measured by each device, and for storing the measurement data in a memory;

selection means for selecting, when a plurality of power values is measured from a single power line, from the power values one power value as a power value measured from the power line, based on a priority assigned beforehand to each device;

power management means for managing power consumed in the demand area using the power value measured from each power line; and power display instruction means for causing a display to display, in a predetermined mode, information indicating the power value measured from each power line.

According to the present disclosure, management and the like of power is enabled by selection of an optimum power value from among a plurality of power values measured from a single power line.

DETAILED DESCRIPTION

Embodiments of the present disclosure are described below in detail in reference to figures.

Embodiment 1

Figure 1:
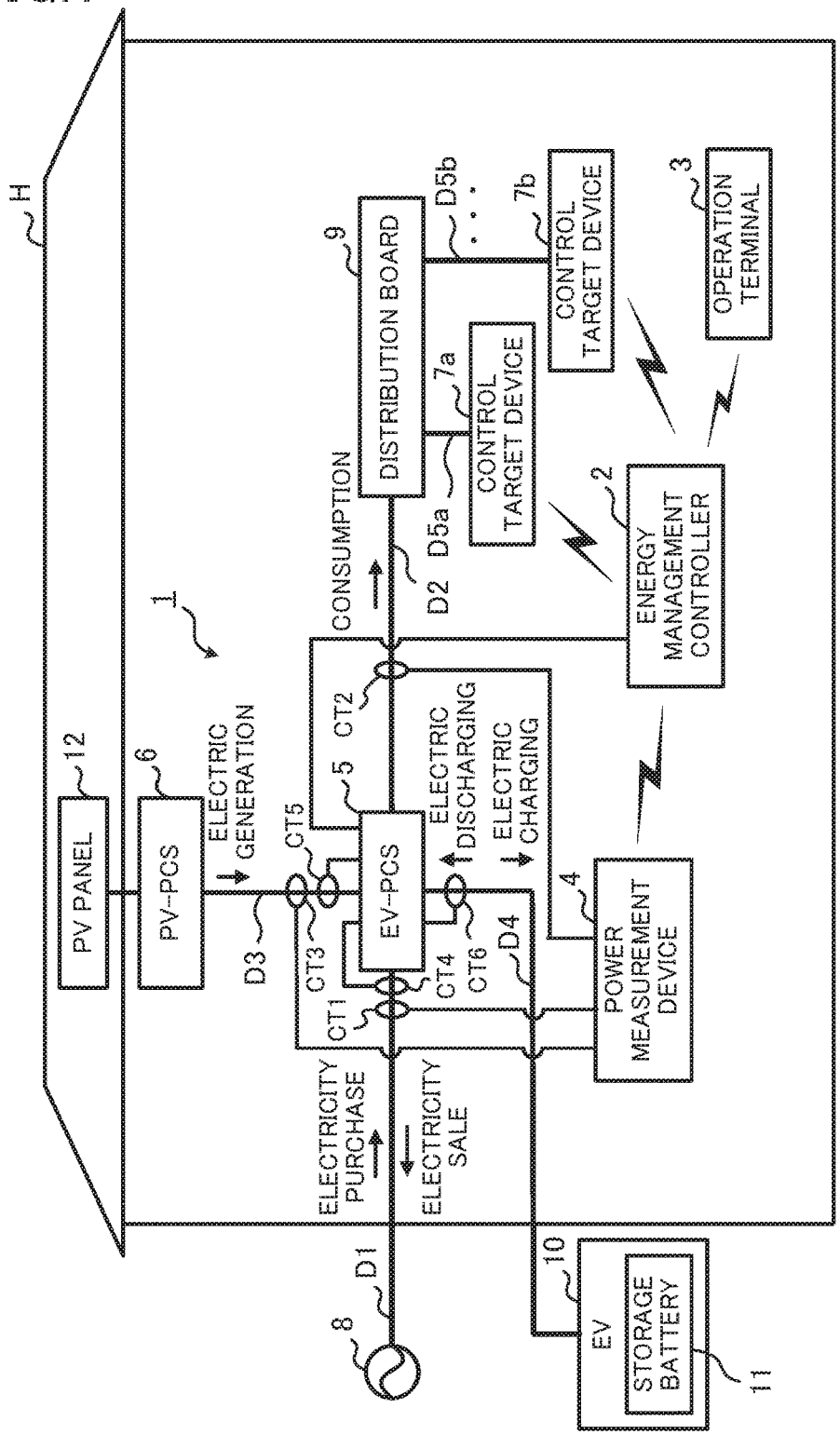
FIG. 1 is a diagram showing an overall configuration of an energy management system according to an Embodiment 1 of the present disclosure.

FIG. 1 is a diagram showing an overall configuration of an energy management system 1 according to an Embodiment 1 of the present disclosure. This energy management system 1 is a so-called home energy management system (HEMS) for managing power used in an ordinary home. The energy management system 1 includes an energy management controller 2, an operation terminal 3, a power measurement device 4, an EV-PCS 5, a PV-PCS 6, and a plurality of control target devices 7 (control target device 7a, 7b, and the like).

Through the operation terminal 3, the energy management controller 2, which is installed at a suitable location within a home H, displays a consumption state of power by monitoring power consumed in the home (demand area). Moreover, the energy management controller 2 performs actions such as operation control, monitoring of the operations state and the like of each control target device 7. The energy management controller 2 is described below in detail.

The operation terminal 3 includes an input device such as a touch panel, a touch pad or the like, a display device such as a liquid crystal display, and a communication interface. The operation terminal 3 performs data communication with the energy management controller 2 based on a widely-known wireless LAN, standard such as Wi-Fi (registered trademark). The operation terminal 3 functions as an interface (user interface) between the energy management system 1 and the user, who is a resident of the home H.

The power measurement device 4 measures a value of power transmitted through each of a plurality of power lines D1, D2 and D3 in this home (demand area). The power line D1 is arranged between a commercial power supply 8 and the EV-PCS 5; the power line D2 is arranged between the EV-PCS 5 and a distribution board 9; and the power line D3 is arranged between the PV-PCS 6 and the EV-PCS 5.

The power measurement device 4 is connected through a communication line to a current transformer (CT) 1 connected to the power line D1, is connected through a communication line to a current transformer (CT) 2 connected to the power line D2, and is connected through a communication line to a current transformer (CT) 3 connected to the power line D3. The CTs 1, 2 and 3 are sensors for measurement of alternating current. The power measurement device 4 measures the power value from the power line D1 based on the measurement results of the CT 1. In a similar manner, the power measurement device 4 measures the power value from the power line D2 based on the measurement results of the CT 2, and measures the power value from the power line D3 based on the measurement results of the CT 3.

Figures 2, 3, 4:
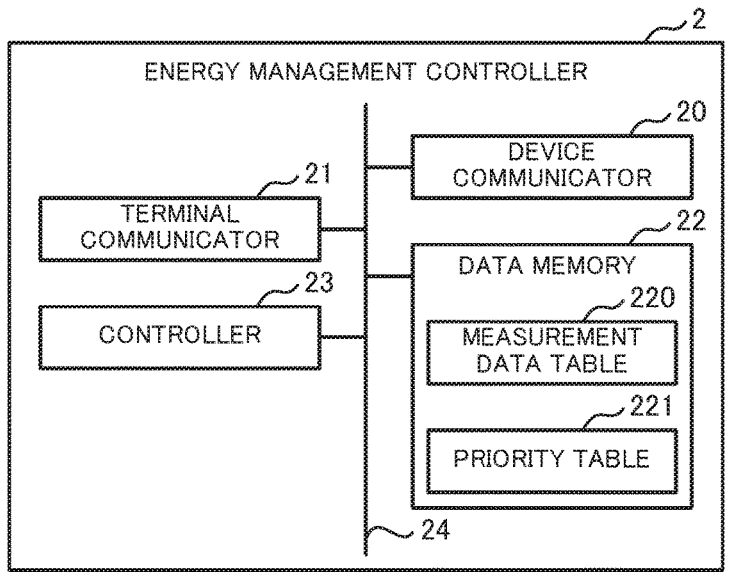
FIG. 2 is a diagram for description concerning measurement data.
FIG. 3 is a block diagram showing a configuration of an energy management controller of the Embodiment 1.
FIG. 4 is a diagram showing an example of a priority table.

The power measurement device 4 includes a wireless communication interface and is connected through a wireless network (not illustrated) constructed in the home H to enable communication with the energy management controller 2. This wireless network is based on a communication protocol such as ECHONET Lite. In response to a request from the energy management controller 2, the power measurement device 4 generates measurement data that includes the measured power value from the power line D1 and transmits the generated measurement data to the energy management controller 2. This measurement data also includes identification (ID) of the power measurement device 4, ID of the power line D1, and measurement time. In the present embodiment, as shown in FIG. 2, the ID of the power measurement device 4 is "10", and the ID of the power line D1 is "01".

In the same manner, in response to a request from the energy management controller 2, the power measurement device 4 transmits to the energy management controller 2 measurement data that includes the ID of the power measurement device 4, the ID of the power line D2, the measurement time, and the measured power value from the power line D2. In the same manner, in response to a request from the energy management controller 2, the power measurement device 4 transmits to the energy management controller 2 measurement data that includes the ID of the power measurement device 4, the ID of the power line D3, the measurement time, and the measured power value from the power line D3. In the present embodiment, the ID of the power line D2 is "02", and the ID of the power line D3 is "03".

The EV-PCS 5 is a power conditioning system used for an electric vehicle (EV) 10. The EV-PCS 5 performs control of charging/discharging of a storage battery 11 that is installed in the EV 10. The EV-PCS 5 charges the storage battery 11 using power supplied from the commercial power supply 8 and/or from the PV-PCS 6. Further, the PV-PCS 6 supplies the power released from the storage battery 11 to the distribution board 9 as power for consumption in this home. Alternatively, the PV-PCS 6 supplies the power released from the storage battery 11 to the commercial power supply 8 as power for sale.

In order to perform control of the aforementioned charging and discharging, the EV-PCS 5 measures the value of power transmitted through each of a plurality of power lines D1, D3 and D4 in this home. The EV-PCS 5 is connected through a communication line to the current transformer (CT) 4 connected to the power line D1, through a communication line to the current transformer (CT) 5 connected to the power line D3, and through a communication line to the current transformer (CT) 6 connected to the power line D4. The EV-PCS 5 measures the power value from the power line D1 based on the measurement results by the CT 4. In the same manner, the EV-PCS 5 measures the power value from the power line D3 based on the measurement results of the CT 5, and measures the power value from the power line D4 based on the measurement results of the CT 6.

The EV-PCS 5 is connected in a communication-capable manner with the energy management controller 2 through a dedicated communication line. In response to a request from the energy management controller 2, the EV-PCS 5 generates measurement data that includes the measured power value from the power line D1 and transmits the measurement data to the energy management controller 2. This measurement data also includes the ID of the EV-PCS 5, the ID of the power line D1, and the measurement time. In the present embodiment, the ID of the EV-PCS 5 is "11".

In the same manner, in response to a request from the energy management controller 2, the EV-PCS 5 transmits to the energy management controller 2 measurement data that includes the ID of the EV-PCS 5, the ID of the power line D3, the measurement time, and the measured power value from the power line D3. In the same manner, in response to a request from the energy management controller 2, the EV-PCS 5 transmits to the energy management controller 2 measurement data that includes the ID of the EV-PCS 5, the ID of the power line D4, the measurement time, and the measured power value from the power line D4. In the present embodiment, the ID of the power line D4 is "04".

The PV-PCS 6 is a power conditioning system for photovoltaics (PV). The PV-PCS 6 performs, using a power conditioner, DC power to AC power conversion of electricity generated by photovoltaic panels (PV panels) 12 and supplies the converted power to the EV-PCS 5 through the power line D3. The power supplied from the PV-PCS 6 is supplied (for consumption) to the distribution board 9 through the EV-PCS 5, is supplied (for sale) to the commercial power supply 8, and is used for charging the storage battery 11.

The control target devices 7 (control target devices 7a, 7b, and the like), for example, are electric appliances installed in the home H, such as a lighting apparatus, an air conditioner, a refrigerator, an induction heating (IH) cooker, a rice cooker, a microwave oven, and a floor heating system. The control target devices 7a, 7b and the like are connected through respective power lines D5a, D5b and the like branching from the power line D2 via the distribution board 9. Each control target device 7 is connected in a communication-capable manner to the energy management controller 2 through the aforementioned non-illustrated wireless network. Further, each control target device 7 may be connected to this wireless network via a non-illustrated external communication adapter.

As shown in FIG. 3, the energy management controller 2 includes a device communicator 20 for communication with the power measurement device 4 and each control target device 7, a terminal communicator 21 for communication with the operation terminal 3, a data memory 22 for storing programs and data, and a controller 23 for controlling these components. These components are interconnected through a bus 24.

The device communicator 20, for example, includes a communication interface such as a wireless LAN card, is connected to the aforementioned wireless network, and under control of the control device 23, performs wireless data communication with the power measurement device 4 and each of the control target devices 7.

The terminal communicator 21 includes a predetermined short-distance wireless communication interface, and under the control of the controller 23, performs data communication with the operation terminal 3 based on a widely-known wireless LAN standard such as Wi-Fi (registered trademark).

The data memory 22, for example, includes a readable/writable nonvolatile semiconductor memory such as a flash memory. The data memory 22 stores a measurement data table 220 and a priority table 221. Moreover, although not illustrated, the data memory 22 stores a program for monitoring power consumed within the home, a program for control of operation of each control target device 7, and data used during execution of such programs.

The measurement data table 220 is a data table that stores respective measurement data sent from the power measurement device 4 and the EV-PCS 5. The priority table 221 is a data table in which priorities of the devices measuring the single power line are defined for each power line. In the present embodiment, the priority table 221, as shown in FIG. 4, is a data table in which the priorities of the power measurement device 4 and the EV-PCS 5 measuring the power lines D1 and D3 are defined for each power line. The priority is a predetermined indicator for determination of, among the two power values measured from the single power line by the power measurement device 4 and the EV-PCS 5, which value is to be selected as the power measured from the power line.

In the present embodiment, the power value measured by a device having a high priority in comparison to other devices is selected (is adopted) as the power value measured from the associated power line. The priority is determined by measurement accuracy according to specifications for each device.

The priority may be determined based on the number of power lines that are subjected to measurement by each device. In the case of such determination, the highest priority is assigned to the device that has the greatest number of power lines that are subjected to measurement. Alternatively, the priority may be determined based upon a sampling interval of the measurement of power for each device. In the case of such determination, the highest priority is assigned to the device that has the shortest sampling interval.

The determination of priorities in the aforementioned manner and the setting of data in the priority table 221, for example, are performed by personnel in charge of construction and the like during installation of the energy management system 1.

Figure 5:
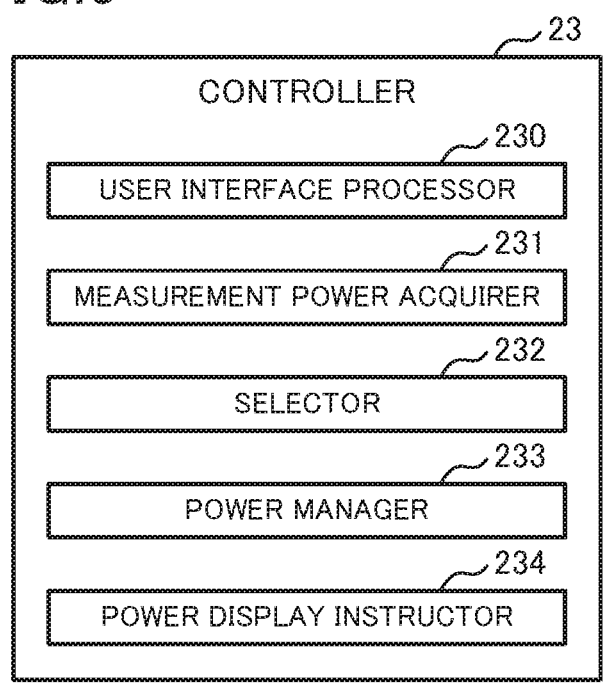
FIG. 5 is a diagram showing a functional configuration of a controller included in the energy management controller of the Embodiment 1.

The controller 23 includes a central processing unit (CPU), read only memory (ROM), random access memory (RAM) and the like (all non-illustrated), and performs overall control of the energy management controller 2. As shown in FIG. 5, the controller 23, as functions specific to the present disclosure, includes a user interface processor 230, a measurement power acquirer 231, a selector 232, a power manager 233 and a power display instructor 234. The functions of these components are achieved by a CPU and the like executing programs stored in the data memory 22.

The user interface processor 230 performs user interface processing through the operation terminal 3. That is to say, the user interface processor 230 receives the operation of the user through the operation terminal 3 and the terminal communicator 21 and performs processing according to contents of the received operation. Moreover, the user interface processor 230 transmits to the operation terminal 3, through the terminal communicator 21, information to be presented to the user, and performs processing to cause the operation terminal 3 to display such information.

The measurement power acquirer 231 performs processing for acquisition of the measured power values from each of the devices, that is, from the power measurement device 4 and the EV-PCS 5. Specifically, the transmission of measurement data is requested at a certain time interval, such as 30-second intervals, for each of the power measurement device 4 and the EV-PCS 5. Through the device communicator 20, the measurement power acquirer 231 acquires a plurality of measurement data sent from the power measurement device 4 and the EV-PCS 5 in response to each of these requests. The measurement power acquirer 231 stores the acquired plurality of measurement data in the measurement data table 220 stored in the data memory 22.

The selector 232 analyzes each of the measurement data acquired by the measurement power acquirer 231 and determines whether a plurality of power values is measured from a single power line. When a plurality of power values is measured from the single power line, then the selector 232 refers to the priority table 221 and selects one power value as the power value subject to use. In the present embodiment, power values are measured by a plurality of devices, that is, the power measurement device 4 and the EV-PCS 5, from the power line D1 and power line D3. The selector 232 refers to the priority table 221 and, for both the power line D1 and the power line D3, selects the power value measured by the EV-PCS 5 as the power value subject to use. The selector 232 deletes from the measurement data table 220 the measurement data relating to the non-selected power values.

The power manager 233 controls operation of each of the control target devices 7 based on the measurement data corresponding to each power line stored in the measurement data table 220. For example, when the power value for electricity sale in the power line D1 is high, and when the power value for consumption in the power line D2 is high, electricity-conservation control is performed to cause a lowering of operating ability of all or specific control target devices 7.

Based on the measurement data corresponding to each of the power lines stored in the measurement data table 220, the power display instructor 234 generates screen data showing in a predetermined mode the state of use of power, including sale of electricity. Then the power display instructor 234 transmits the generated screen data to the operation terminal 3 through the user interface processor 230 and the terminal communicator 21.

Figure 6:
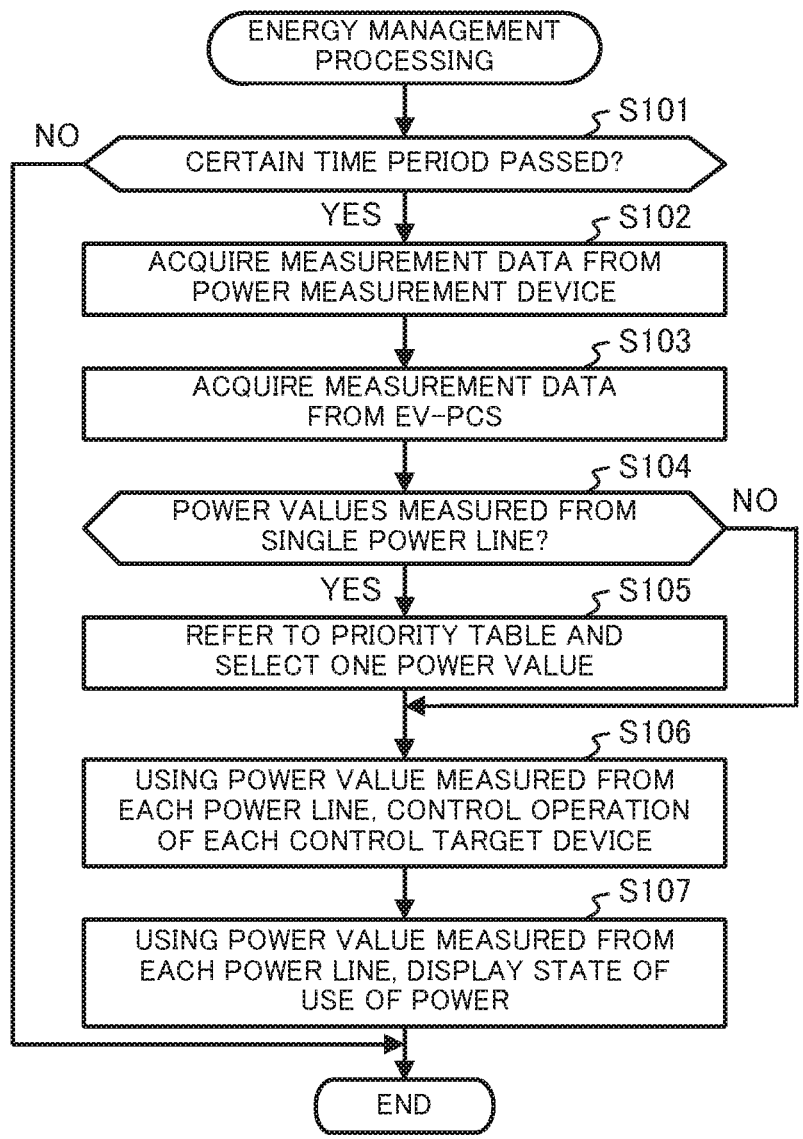
FIG. 6 is a flowchart showing a procedure of energy management processing of the Embodiment 1.

FIG. 6 is a flowchart showing a procedure of energy management processing executed by the controller 23 of the energy management controller 1. This energy management processing is executed repeatedly at a certain time interval, such as 1-second intervals.

The measurement power acquirer 231 determines whether a certain time period, such as 30 seconds, has passed since acquisition of the previous measurement data (step S101). If the certain time period has not passed (NO in step S101), then energy management processing ends. On the other hand, if the certain time period has passed since acquisition of the previous measurement data (YES in step S101), the measurement power acquirer 231 requests the power measurement device 4 to transmit measurement data, and acquires the measurement data sent from the power measurement device 4 in response to the request (step S102).

Further, the measurement power acquirer 231 requests the EV-PCS 5 to transmit measurement data and acquires the measurement data sent from the EV-PCS 5 in response to the request (step S103).

The selector 232 analyzes each of the measurement data acquired by the measurement power acquirer 231 and determines whether a plurality of power values is measured from a single power line (step S104). If there exists no plurality of power values measured from a single power line (NO in step S104), then the control device 23 performs the processing of step S106. On the other hand, if there exists a plurality of power values measured from a single power line (YES in step S104), then the selector 232 refers to the priority table 221 and selects one power value as the power value subject to use (step S105). At this time, the selector 232 deletes from the measurement data table 220 the measurement data relating to the non-selected power values.

The power manager 233 controls operation of each of the control target devices 7 based on the measurement data corresponding to each of the power lines stored in the measurement data table 220 (step S106). Further, the power display instructor 234 generates screen data for showing the state of use of power, and by transmission to the operation terminal 3 through the user interface processor 230 and the terminal communicator 21, causes the operation terminal 3 to display the state of use of power (step S107).

According to the energy management system 1 of Embodiment 1 of the present disclosure in the aforementioned manner, when there exists a plurality of devices that measure a single power line, the energy management controller 2 selects the power value measured by the device assigned the highest priority as the power value subject to use. Thus the user can be presented with an accurate state of use of power, and accurate operation control of each control target device 7 can be achieved.

Embodiment 2

An Embodiment 2 of the present disclosure is described below. Further, components and the like that occur in common with the Embodiment 1 are assigned the same reference signs, and description of such components is omitted.

According to the present embodiment and in the same manner as in Embodiment 1, the energy management controller 2 selects the power values measured by the EV-PCS 5 for the power line D1 and the power line D3 as the power value subject to use. Moreover, since the only device for measurement of the power value for the power line D2 is the power measurement device 4, the power value measured by the power measurement device 4 is the power value subject to use. Further, the EV-PCS 5 is the only device for measurement of the power value for the power line D4, and thus the power value measured by the EV-PCS 5 is the power value subject to use.

Figure 7:
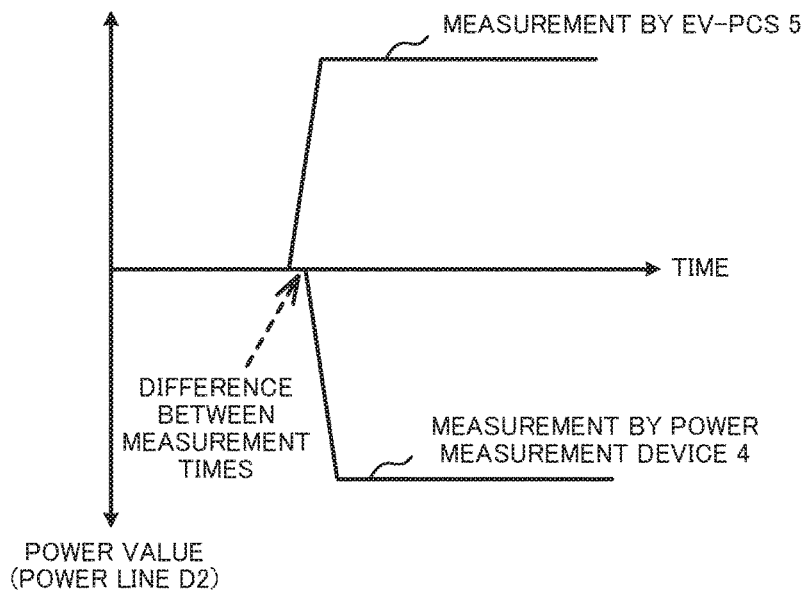
FIG. 7 is a diagram for description of a difference between measurement times in an Embodiment 2 of the present disclosure.

The interval of the power measurements, that is, the sampling interval of power measurement, cannot be said to necessarily be the same for the power measurement device 4 and the EV-PCS 5, and even if the sampling interval is assumed to be the same, performing synchronized measurements would be difficult. In other words, a difference between measurement times occurs between the power measurement device 4 and the EV-PCS 5 as indicated in FIG. 7.

The energy management controller 2 of the present embodiment has functions similar to those of the energy management controller 2 of Embodiment 1, and further, has a function for correction of the aforementioned type of difference between measurement times of the power value.

Figure 8:
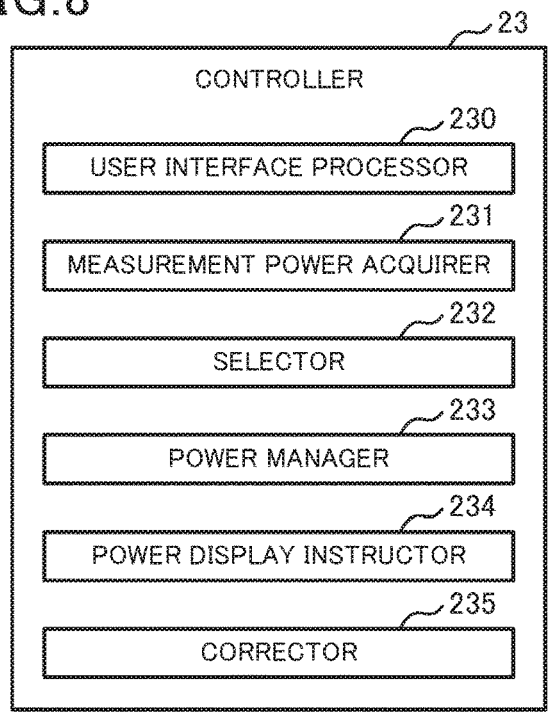
FIG. 8 is a diagram showing a functional configuration of a controller included in an energy management controller of the Embodiment 2.
Figure 9:
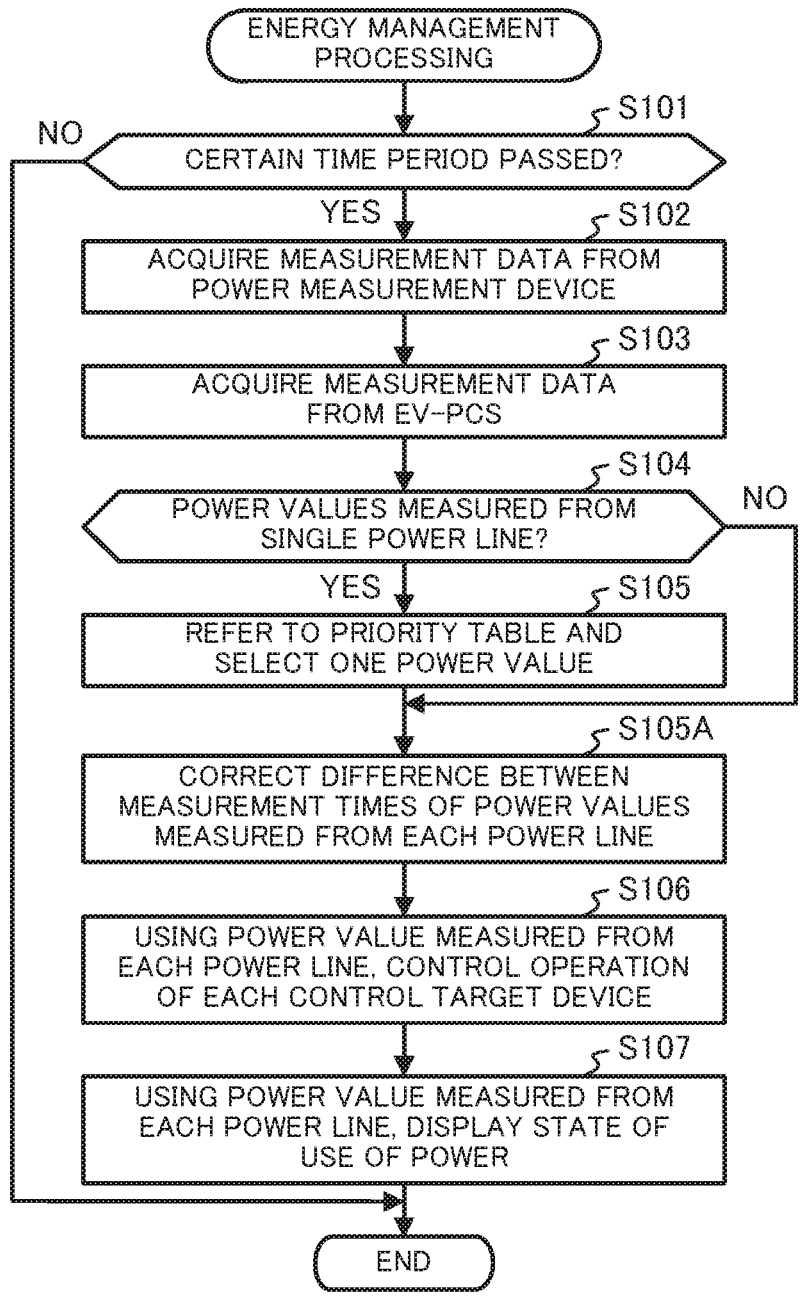
FIG. 9 is a flowchart showing a procedure of energy management processing of the Embodiment 2.

As shown in FIG. 8, a corrector 235 is added to the controller 23 included in the energy management controller 2 of the present embodiment. The corrector 235 corrects the difference between the measurement times of the power values measured from each of the power lines, based on measurement data corresponding to each power line that is stored in the measurement data table 220 (step S105A of FIG. 9).

For example, the corrector 235 reads the measurement data of a predetermined time period (for example, 10 minutes) from the measurement data table 220, and detects the rise time based on each measurement data read thereby. Then the corrector 235 corrects the difference between the measurement times by comparing the detected rise times using the measurement data for the respective power lines (such as the power lines D1 and D2).

More specifically, for example, when a difference between the rise times for the power line D1 and the power line D2 occurs within a predetermined time period (such as within 10 seconds) in the comparison between respective measurement data for the power line D1 and the power line D2, the corrector 235 determines that a difference between the measurement times is occurring. Then the corrector 235 corrects the difference between the measurement times by matching (changing to match) the rise time of the later measurement data with the rise time of the earlier measurement data.

Alternatively, the corrector 235 may read the measurement data of a predetermined time period (such as 10 minutes) from the measurement data table 220, and may correct the difference between the measurement times by executing averaging processing, over the predetermined time period, of measurement data read for each power line.

In the above manner, according to the energy management system 1 of Embodiment 2, the difference between the measurement times of the power values measured from each of the power lines is corrected. Thus the user can be presented with more accurate state of use of power, and more accurate operation control of each control target device 7 can be achieved.

Furthermore, the present disclosure is not limited to each of the aforementioned embodiments, and naturally various types of modifications are possible within a scope that does not depart from the gist of the present disclosure.

Figure 10:
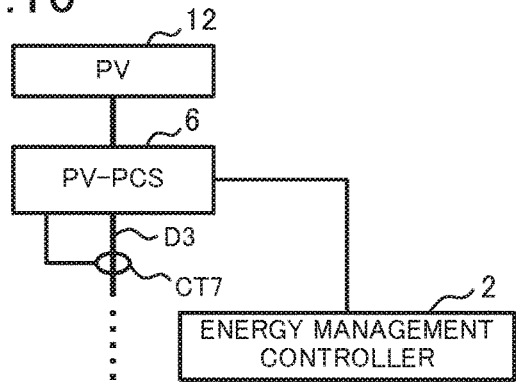
FIG. 10 is a diagram for description of an example (no. 1) in which power is measured by a different device.

For example, although the power measurement device 4 and the EV-PCS 5 are cited as the devices for measurement of the power values in each of the aforementioned embodiments, power values may be measured by other devices. For example, as shown in FIG. 10, a PV-PCS 6 may measure the power value from the power line D3. In this case, the PV-PCS 6 is connected through a communication line with a current transformer (CT) 7 connected to the power line D3. The PV-PCS 6 measures the power value from the power line D3 based on the measurement results of the CT 7.

Moreover, the PV-PCS 6 is connected in a communication-capable manner with the energy management controller 2 through a dedicated communication line. In response to a request from the energy management controller 2, the PV-PCS 6 transmits to the energy management controller 2 measurement data including the measured power value from the power line D3.

Figure 11:
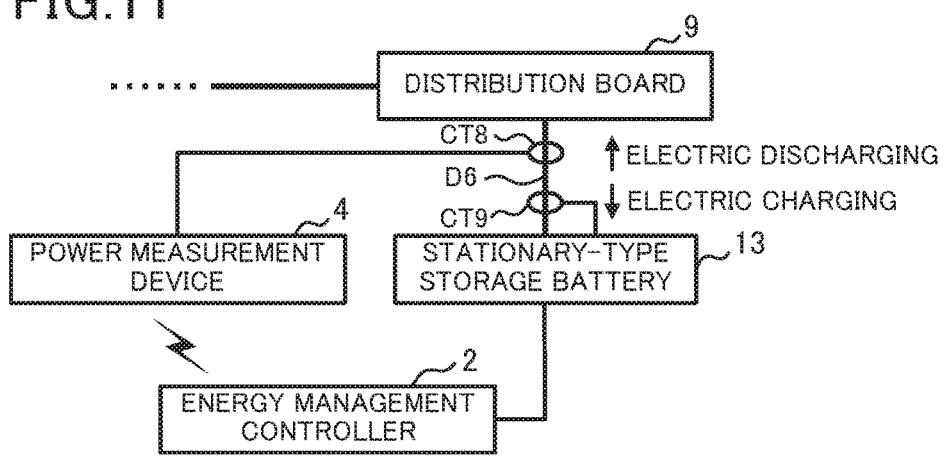
FIG. 11 is a diagram for description of an example (no. 2) in which power is measured by a different device.

Moreover, as shown in FIG. 11, to the configuration of the energy management system 1, a stationary-type storage battery 13 may be added that is connected to the power line D6 by branching from the distribution board 9, and the power value for the power line D6 may be measured by each of the power measurement device 4 and the stationary-type storage battery 13.

In the aforementioned configuration, the power measurement device 4 connects through a communication line with a current transformer (CT) 8 connected to the power line D6, and measures the power value from the power line D6 based on the measurement results of the CT 8. In response to a request from the energy management controller 2, the power measurement device 4 transmits to the energy management controller 2 measurement data including the measured power value from the power line D6. Moreover, the stationary-type storage battery 13 is connected through a communication line with a current transformer (CT) 9 connected to the power line D6, and measures the power value from the power line D6 based on the measurement results of the CT 9. The stationary-type storage battery 13 is communicatively connected through a dedicated communication line with the energy management controller 2, and in response to a request from the energy management controller 2, transmits to the energy management controller 2 measurement data including the measured power value from the power line D6.

Figure 12:
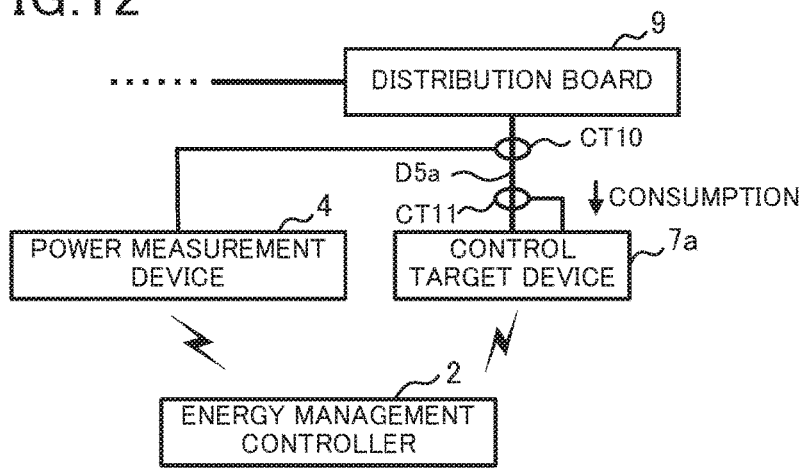
FIG. 12 is a diagram for description of an example (no. 3) in which power is measured by a different device.

Further, as shown in FIG. 12, the power value for the power line D5a branching from the distribution board 9 may be measured by each of the power measurement device 4 and the control target device 7a. In this configuration, the power measurement device 4 connects through a communication line with a current transformer (CT) 10 connected to the power line D5a, and measures the power value from the power line D5a based on the measurement results of the CT 10. In response to a request from the energy management controller 2, the power measurement device 4 transmits to the energy management controller 2 measurement data including the measured power value from the power line D5a.

Further, the control target device 7a connects through a communication line with a current transformer (CT) 11 connected to the power line D5a, and measures the power value from the power line D5a based on the measurement results of the CT 11. In response to a request from the energy management controller 2, the control target device 7a transmits to the energy management controller 2 measurement data including the measured power value from the power line D5a.

Moreover, in each of the aforementioned embodiments, a program for execution by the energy management controller 2 may be stored and distributed in a computer-readable recording medium such as a compact disc read-only memory (CD-ROM), a digital versatile disc (DVD), a magneto-optical disk (MO), a universal serial bus (USB) memory and a memory card. By installation of this program in a dedicated or general-purpose computer, the computer can function as the energy management controller 2 of each of the aforementioned embodiments.

The above-described program may be stored on a disk device or the like of a server device on a communication network such as the Internet to enable the program to be downloaded to the computer, for example by superimposing the program onto a carrier wave. Moreover, the aforementioned processing can be achieved even by execution while the program is transferred through the communication network. Furthermore, the aforementioned processing can be achieved by executing all or part of the program on the server device, and executing the program while sending and receiving by the computer the information relating to such processing through the communication network.

Moreover, if the aforementioned functions are executed by sharing the functions between an operating system (OS) and application programs, or are executed by both the OS and the application programs in cooperation with each other, the non-OS portion alone may be stored and distributed in the aforementioned recording medium, or alternatively, may be, for example, downloaded to the computer.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

INDUSTRIAL APPLICABILITY

The present disclosure may be used with advantage for a system and the like for management of electric power used within a household.

The invention claimed is:

1. An energy management controller comprising a central processing unit (CPU) configured to:
   acquire, by an acquirer, for one power line in a demand area, from a plurality of devices, a plurality of power values measured by the respective devices;
   select, by a selector, one power value from the plurality of power values based on a priority assigned beforehand to each device; and
   cause, by a display instructor, a display to display, in a predetermined mode, information indicating the selected one power value, wherein
   the priority is determined based on a number of power lines that are subjected to measurement by each device in the demand area; and
   the priority that is highest is assigned to the device having the number of power lines that are subjected to measurement that is greatest.

2. An energy management controller comprising a central processing unit (CPU) configured to:
   acquire, by an acquirer, for one power line in a demand area, from a plurality of devices, a plurality of power values measured by the respective devices;

select, by a selector, one power value from the plurality of power values based on a priority assigned beforehand to each device; and cause, by a display instructor, a display to display, in a predetermined mode, information indicating the selected one power value, wherein the priority is determined based on a sampling interval for power measurement of each device; and the priority that is highest is assigned to the device having the sampling interval that is shortest.

3. An energy management controller comprising a central processing unit (CPU) configured to:

acquire, by an acquirer, for a plurality of power lines in a demand area, from a plurality of devices, a plurality of power values measured by the plurality of devices;

select, by a selector, when a plurality of power values is measured from a single power line, from the power values one power value as a power value measured from the power line, based on a priority assigned beforehand to each device;

cause, by a display instructor, a display to display, in a predetermined mode, information indicating a power value measured from each power line; and correct, by a corrector, a difference between measurement times of the plurality of power values measured from the plurality of power lines.

4. The energy management controller according to claim 3, wherein the acquirer stores data relating to the plurality of power values in a memory, and the corrector: reads the data of a predetermined time period from the memory; detects a rise time of power based on each data read thereby; and corrects the difference between the measurement times by comparing the detected rise times using the data for each power line.

5. The energy management controller according to claim 3, wherein the acquirer stores data relating to the plurality of power values in a memory, and the corrector: reads the data of a predetermined time period from the memory; and corrects the difference between the measurement times by executing averaging processing, over a predetermined time period, of the data read for each power line.

6. An energy management method comprising:

acquiring, by an acquirer, for one power line in a demand area, from a plurality of devices, a plurality of power values measured by the respective devices;

selecting, by a selector, one power value from the plurality of power values based on a priority assigned beforehand to each device; and causing, by a display instructor, a display to display, in a predetermined mode, information indicating the selected one power value, wherein the priority is determined based on a number of power lines that are subjected to measurement by each device in the demand area; and the priority that is highest is assigned to the device having the number of power lines that are subjected to measurement that is greatest.

7. A non-transitory computer-readable recording medium having stored therein a program to cause a central processing unit (CPU) included in a computer to function as:

an acquirer configure to acquire, for one power line in a demand area, from a plurality of devices, a plurality of power values measured by the respective devices;

a selector configured to select one power value from the plurality of power values based on a priority assigned beforehand to each device; and a display instructor configured to cause a display to display, in a predetermined mode, information indicating the selected one power value, wherein the priority is determined based on a number of power lines that are subjected to measurement by each device in the demand area; and the priority that is highest is assigned to the device having the number of power lines that are subjected to measurement that is greatest.

8. An energy management method comprising:

acquiring, by an acquirer, for a plurality of power lines in a demand area, from a plurality of devices, a plurality of power values measured by the plurality of devices;

selecting, by a selector, when a plurality of power values is measured from a single power line, from the power values one power value as a power value measured from the power line, based on a priority assigned beforehand to each device;

causing, by a display instructor, a display to display, in a predetermined mode, information indicating a power value measured from each power line; and correcting, by a corrector, a difference between measurement times of the plurality of power values measured from the plurality of power lines.

9. A non-transitory computer-readable recording medium having stored therein a program to cause a central processing unit (CPU) included in a computer to function as:

an acquirer configure to acquire, for a plurality of power lines in a demand area, from a plurality of devices, a plurality of power values measured by the plurality of devices;

a selector configured to select, when a plurality of power values is measured from a single power line, from the power values one power value as a power value measured from the power line, based on a priority assigned beforehand to each device;

a display instructor configured to cause a display to display, in a predetermined mode, information indicating a power value measured from each power line; and a corrector configured to correct a difference between measurement times of the plurality of power values measured from the plurality of power lines.

* * * * *